United States Patent
Gallas et al.

(10) Patent No.: US 10,957,398 B2
(45) Date of Patent: Mar. 23, 2021

(54) ELECTRONIC DEVICE WITH MEMORY ERASED BY PAGE

(71) Applicant: GEMALTO SA, Meudon (FR)

(72) Inventors: Frederic Gallas, Meudon (FR); Rudy Yanto, Meudon (FR); Vincent Dumas, Meudon (FR); Fabrice Vergnes, Meudon (FR)

(73) Assignee: THALES DIS FRANCE SA, Meudon (FR)

(*) Notice: Subject to any disclaimer, the term of this patent is extended or adjusted under 35 U.S.C. 154(b) by 11 days.

(21) Appl. No.: 15/779,311

(22) PCT Filed: Nov. 25, 2016

(86) PCT No.: PCT/EP2016/078823
§ 371 (c)(1),
(2) Date: May 25, 2018

(87) PCT Pub. No.: WO2017/089546
PCT Pub. Date: Jun. 1, 2017

(65) Prior Publication Data
US 2018/0330795 A1   Nov. 15, 2018

(30) Foreign Application Priority Data
Nov. 26, 2015  (EP) .................................. 15306881

(51) Int. Cl.
*G11C 16/16*       (2006.01)
*G11C 16/04*       (2006.01)
(Continued)

(52) U.S. Cl.
CPC .............. *G11C 16/16* (2013.01); *G06F 3/064* (2013.01); *G06F 3/0608* (2013.01);
(Continued)

(58) Field of Classification Search
CPC ...... G06F 3/0608; G06F 3/064; G06F 3/0652; G06F 3/0679
See application file for complete search history.

(56) References Cited

U.S. PATENT DOCUMENTS

2005/0185463 A1* 8/2005 Kanamori ............. G11C 16/20
                                                    365/185.04
2006/0143365 A1   6/2006 Kikuchi
(Continued)

OTHER PUBLICATIONS

Andrew Birrell et al: "A design for high-performance flash disks". ACM SIGOPS Operating Systems Review, vol. 41, No. 2, Apr. 2, 2007, pp. 88-93, XP055060311, ISSN: 0163-5980, DOI: 10.1145/1243418.1243429 p. 90, left-hand column, paragraph 5; figure 3, p. 93, left-hand column, paragraph 4—right-hand column, paragraph 1.
(Continued)

*Primary Examiner* — Aracelis Ruiz
(74) *Attorney, Agent, or Firm* — The Jansson Firm; Pehr B. Jansson

(57) ABSTRACT

The invention relates to a method for managing an memory LNVM erasable by block. The method comprises an index management of the memory blocks wherein the index indicates if a block is erased (Erased) or to be erased (TBE). A memory manager performs a block erasing when the memory is not in use and a block is to be erased and when the number of erased blocks is lower than a predetermined number.

15 Claims, 6 Drawing Sheets

| Virt@ | Phy@ | Erased | TBE |
|---|---|---|---|
| 00 | 07 | No | No |
| 01 | 03 | No | No |
| 02 | 04 | No | No |
| 03 | 05 | No | No |
| 04 | 0C | No | No |
| 05 | 0F | No | No |
| 06 | 06 | Yes | No |
| 07 | 0B | Yes | No |
| 08 | 02 | Yes | No |
| 09 | 0E | Yes | No |
| 0A | 10 | No | Yes |
| 0B | 00 | No | Yes |
| 0C | 09 | No | Yes |
| 0D | 0D | No | Yes |
| 0E | 08 | No | No |
| 0F | 01 | No | No |

(51) Int. Cl.
*G11C 16/32* (2006.01)
*G06F 3/06* (2006.01)
(52) U.S. Cl.
CPC .......... *G06F 3/0652* (2013.01); *G06F 3/0679* (2013.01); *G11C 16/0483* (2013.01); *G11C 16/32* (2013.01)

(56) References Cited

U.S. PATENT DOCUMENTS

| | | | |
|---|---|---|---|
| 2009/0157989 A1* | 6/2009 | Karamcheti | G06F 12/0246 |
| | | | 711/156 |
| 2013/0051144 A1 | 2/2013 | Suzuki | |
| 2015/0089178 A1* | 3/2015 | Furdui | G06F 3/0673 |
| | | | 711/165 |
| 2015/0277795 A1 | 10/2015 | Choi | |

OTHER PUBLICATIONS

PCT/EP2016/078823, International Search Report, dated Feb. 1, 2017, European Patent Office, P.B. 5818 Patentlaan 2 NL—2280 HV Rijswijk.

PCT/EP2016/078823, Written Opinion of the International Searching Authority, dated Feb. 1, 2017, European Patent Office, P.B. 5818 Patentlaan 2 NL—2280 HV Rijswijk—Pays Bas.

* cited by examiner

| Data Area | Meta Data Area ||
|---|---|---|
| | CS/ECC | Memory Management |
| 2048 Bytes | 64 Bytes | 64 Bytes |

Figure 2

| Meta Data Area |||||| 
|---|---|---|---|---|---|
| CS/ECC | Used | NMU | Virt@ | EQ Nb | Other |
| 64 bytes | 1 bit | 1 bit | 1 byte | 1 byte | 60 bytes and 6bits |

Figure 3

| Meta Data Area |||||| 
|---|---|---|---|---|---|
| CS/ECC | Used[0-7] | NMU [0-7] | Virt@ [0-7] | EQ Nb | Other |
| 8*8 bytes | 1 byte | 1 byte | 12 bytes | 1 byte | 49 bytes |

Figure 4

| @ | Data | ECC | Used | NMU | Virt@ | EQ Nb |
|---|---|---|---|---|---|---|
| 00 | Written | Written | 0 | 0 | Not Val. | 05 |
| 01 | Written | Written | 0 | 1 | 0F | FF |
| 02 | FF—FF | FF—FF | 1 | 1 | FF | FF |
| 03 | Written | Written | 0 | 1 | 01 | FF |
| 04 | Written | Written | 0 | 1 | 02 | FF |
| 05 | Written | Written | 0 | 1 | 03 | FF |
| 06 | FF—FF | FF—FF | 1 | 1 | FF | FF |
| 07 | Written | Written | 0 | 1 | 00 | FF |
| 08 | Written | Written | 0 | 1 | 0E | FF |
| 09 | Written | Written | 0 | 0 | Not Val. | 06 |
| 0A | Written | Written | 0 | 0 | Not Val. | 08 |
| 0B | FF—FF | FF—FF | 1 | 1 | FF | FF |
| 0C | Written | Written | 0 | 1 | 04 | FF |
| 0D | Written | Written | 0 | 0 | Not Val. | 07 |
| 0E | FF—FF | FF—FF | 1 | 1 | FF | FF |
| 0F | Written | Written | 0 | 1 | 05 | FF |
| 10 | Written | Written | 0 | 0 | Not Val. | 04 |
| 11 | Written | Written | 0 | 0 | Not Val. | 09 |
| 12 | Written | Written | 0 | 0 | Not Val. | 0A |
| 13 | Written | Written | 0 | 0 | Not Val. | 0B |

Figure 5

| Virt@ | Phy@ | Erased | TBE |
|---|---|---|---|
| 00 | 07 | No | No |
| 01 | 03 | No | No |
| 02 | 04 | No | No |
| 03 | 05 | No | No |
| 04 | 0C | No | No |
| 05 | 0F | No | No |
| 06 | 06 | Yes | No |
| 07 | 0B | Yes | No |
| 08 | 02 | Yes | No |
| 09 | 0E | Yes | No |
| 0A | 10 | No | Yes |
| 0B | 00 | No | Yes |
| 0C | 09 | No | Yes |
| 0D | 0D | No | Yes |
| 0E | 08 | No | No |
| 0F | 01 | No | No |

Figure 6

| Virt@ | Phy@ | Erased | TBE |
|---|---|---|---|
| 00 | 07 | No | No |
| 01 | 03 | No | No |
| 02 | 04 | No | No |
| 03 | 05 | No | No |
| 04 | 0C | No | No |
| 05 | 0F | No | No |
| 06 | 06 | No | No |
| 07 | 0B | Yes | No |
| 08 | 02 | Yes | No |
| 09 | 0E | Yes | No |
| 0A | 10 | No | Yes |
| 0B | 00 | No | Yes |
| 0C | 09 | No | Yes |
| 0D | 0D | No | Yes |
| 0E | 08 | No | No |
| 0F | 01 | No | No |

Figure 7

| Virt@ | Phy@ | Erased | TBE |
|---|---|---|---|
| 00 | 07 | No | No |
| 01 | 03 | No | No |
| 02 | 04 | No | No |
| 03 | 05 | No | No |
| 04 | 0C | No | No |
| 05 | 0F | No | No |
| 06 | 06 | No | No |
| 07 | 0B | Yes | No |
| 08 | 02 | Yes | No |
| 09 | 0E | Yes | No |
| 0A | 10 | Yes | No |
| 0B | 00 | No | Yes |
| 0C | 09 | No | Yes |
| 0D | 0D | No | Yes |
| 0E | 08 | No | No |
| 0F | 01 | No | No |

Figure 8

ELECTRONIC DEVICE WITH MEMORY ERASED BY PAGE

FIELD OF THE INVENTION

The invention relates to an electronic device with memory erased by page. More particularly the invention is related to memory having an erasing by page with strong timing constraints.

BACKGROUND OF THE INVENTION

Electronic memories are today essential for electronic devices using a microprocessor. Non volatile memories are memory that retains information when power is switch off. Amongst the non volatile memories there are memories that are electrically erasable, well known under the name of EEPROM or E2PROM. Typically a floating gate memorizes an electrical charge when the power is off. The charged state and the discharged state of the gate are associated to a logical level, zero or one of a binary information called bit. The charging and the discharging of the floating gate are made according two different polarizations of the floating gate transistor. In term of memory management two operations are performed. An erasing operation is performed for placing the bit in a first state and a writing operation is made for placing the bit in the other state. For making these operations, the floating gate transistor must be selected and several selection transistors are required.

In view to make big matrix of memories, it is well known to reduce the number of selection transistors. The memory matrix is often divided in groups of bits that can be selected simultaneously. Groups of bits have different names like words, pages and blocks depending of the size. Commonly, a word corresponds to one or two bytes, a page comprises several words, for example 256 to 1024 words and a block may comprise several pages, for example 16 to 64 pages. The different groups are used depending of the memory size. Small E2PROM can be written and erased by word. Very large Flash memory are written by page and erased by block. Intermediate memory can be written and erased by pages. The time and consumption for writing or erasing operations depend on the size of the group of bits. The larger the group is, the larger the capacity to charge is. In view to limit current peaks, it is known to increase the time of the operation. Commonly, a page to erase can take 1 to 10 ms depending on the block size and around the same time to be written.

In case of a memory managed by pages (and/or blocks), some status bits are associated to each page for indicating that the page is currently in use, is written but no more in use, or is erased. Commonly, the page management is made like the sectors of an hard drive: a page is erased just before to be reuse, such a method authorizes to retrieve an "erased" file till the page is not re-used. For avoiding too much stress on the memory cells, it is known to manage the pages in a circular manner, i.e. all the pages have to be used before reusing a page.

According to a conventional memory management, when a data is to be modified inside a file, the corresponding page has to be re-written in another page with the modified data. The memory controller has to find the next available page that is erased or no more in use. After all pages are used at least once, the memory controller can only find pages that are no more in use. The writing time is transformed into the addition of an erasing time and a writing time.

Considering a contactless device compliant with ISO14443, the contactless device may not have a battery or may work in a battery off mode. In that case the contactless device is powered by the electromagnetic field provided by a reader device. A contactless communication according ISO 14443 is very fast, in general it should be done in few hundreds of milliseconds. Sometimes, a request necessitates the rewriting of few data at different places. With a conventional memory management, when all the memory has been written at least one, the time to perform such a request can be very long and as an example more than one second. To be sure to complete the request, the user of the device must maintain the contactless device inside the electromagnetic field preferably without move to be sure to have the optimal transmission. In case of a move before the completion of the request, an error transmission may occur in the last feedback message and the request is to be re-sent a second time.

SUMMARY OF THE INVENTION

The aim of the invention is to reduce the time for processing a request in a contactless transaction in such a way to reduce transmission error. The invention proposes to manage differently the memory by the use of a pool of free pages that prevent any page erasing during the writing of data. The pool of free pages can be erased during a non critical time in such a way during the processing of a contactless request, no time is required for the erasing of a page.

More particularly the invention is a method for managing a memory erasable by block. The method comprises an index management of the memory block wherein the index indicates if a block is erased or to be erased. A memory manager performs a block erasing when the memory is not in use and a block is to be erased and when the number of erased blocks is lower than a predetermined number.

Preferentially, the block erasing is made on the oldest available block that is not erased. The index management is made on a number of blocks lower than the total number of blocks of the memory.

On a preferred embodiment, the memory is inside an electronic device receiving commands according ISO7816 or ISO14443, and wherein the block erasing is made during an idle time of said commands.

On another point of view, the invention is an electronic device comprising at least one electrically erasable memory which is erasable by blocks and a memory controller. The memory controller performs a block erasing when the memory is not in use and a block is to be erased and when the number of erased blocks is lower than a predetermined number.

BRIEF DESCRIPTION OF THE DRAWINGS

The invention will be better understood after the reading of the following Description of the Preferred Embodiments that makes references to the annexed drawings in which:

FIGS. 2 to 4 show some example of structure of a memory array, FIG. 5 shows an example of memory mapping using the invention, and, FIG. 6 shows an example of index of the memory mapping of the FIG. 5.

FIG. 7 shows the example of the memory index of FIG. 6 after a write operation to a block.

FIG. 8 shows the example of the memory index of FIGS. 6 and 7 after a subsequent erasure of a block.

DESCRIPTION OF THE PREFERRED EMBODIMENTS

Figure 1:
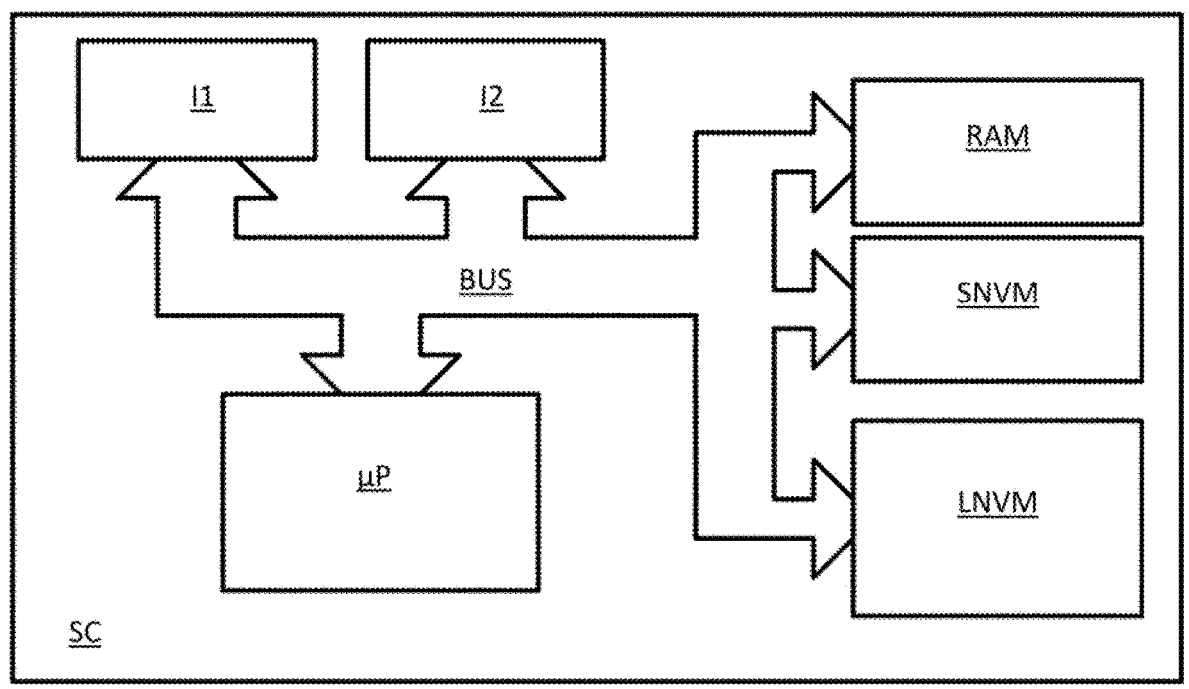
FIG. 1 shows a schematic diagram of an example of device in which the invention is implemented.

As indicated before, the problem solved by the invention is related to the time needed for performing a transaction in some contactless transaction which are commonly used in the smartcard world. So the preferred example of device implementing the invention is a smartcard SC as shown on FIG. 1. Nevertheless, the example can be transposed to other kind of device comprising the similar component and having comparable time constraints.

The Smartcard SC comprises a microprocessor µC coupled to a central bus BUS to which are connected a first interface I1, a second interface I2, a volatile memory RAM, a short and fast non volatile memory SNVM and a large non volatile memory LNVM. The first interface is for example a communication interface according to ISO7816 that can receive and answer to commands when the smartcard SC is plugged into a reader. The second interface is a for example a contactless interface according to ISO14443 that can receive and answer to commands when the smartcard SC is inside the electromagnetic field of a reader.

The volatile memory RAM is commonly used for storing temporarily part of the code and the data during the running of programs, for preparing the messages to send and also as buffer before data storage in the large non volatile memory LNVM. The small and fast non volatile memory SNVM is a non volatile memory that can be accessed in read write by words so it can be used like a volatile memory that can be saved when power is turned off. The SNVM is relatively expensive in term of space occupation so the operating system uses it for storing some parameters that change a lot and that should be memorized between two powered sessions. The large non volatile memory LNVM is used as a mass memory, as an example Flash memory is used. To have a high integration level, such a memory is accessed by block.

The memory structure of a block inside a Flash memory comprises a data area and metadata area, as disclosed on FIG. 2. Typically, the metadata are separated in two groups, a first group being dedicated to data integrity and a second group being dedicated to memory management. The example of FIG. 2 shows a memory block of 2 kBytes comprising additional 128 Bytes for metadata. The first group CS/ECC comprises Check Sum of the data and an Error Correction Code for retrieving the data in case some bits are altered in the data area. The second group may comprise a lot of information for retrieving the memory mapping, the block chaining and other information. Typically, the metadata are a duplication of information that enable to retrieve all the memory structure in case of loss of the file of memory management by the operating system or the memory controller.

For the following explanation, we take into consideration that the memory is a NAND Flash, i.e. with erased state at level 1 for each bit. With such a memory it is possible to write several times a same block but in that case only the bits at level 1 can be write at level zero. Once a bit is at level 0, a complete erasing of the block is needed for putting the bit to level 1. Such a multiple write is commonly implemented for modifying bit by bit the metadata.

On FIG. 3, the second group is detailed for indicating the bits and Bytes of metadata that are used for the memory management according to the invention. A first bit indicates if the block is Used, this bit is written at low level once at least a part of the data area is written. A second bit NMU indicates that a block is no more use, this NMU bit is written at zero when the data area should be considered to be erased. Once the NMU bit is set to level 0, the block can be selected for its erasing. A first field Virt@ contains the virtual block address corresponding to the physical block address. Such virtual address Virt@ can be written only when the data area is written. The erasing of the virtual address is made only when the block is erased. The size of the field Virt@ is determined for addressing all the addresses, i.e. one Byte enable to address 256 blocks. A second field EQ Nb contains a number representative of the position of the block in the erasing queue. The second field EQ NB is written when the NMU bit is set to level 0, the value being the next value after the higher value recorded in one block. This number should be at least equal to the maximum number of blocks in the memory. Of course other information can be stored in the metadata area but they are not essential for the invention.

As indicated, a block can be subdivided into pages for the writing. FIG. 4 shows an adaptation of the metadata area in the case the block contains 8 pages with an erasing made by block. The first group CS/ECC will be divided in 8 groups of 8 bytes, each group corresponding to one page. The first bit Used is transformed into a word of 8 bits Used[0-7], each bit being dedicated to one page. The bit NMU is transformed into a word of 8 bits NMU[0-7], each bit being dedicated to one page. The field Virt@ is also modified for comprising 8 field corresponding to the virtual address of each page. The field EQNb remains unchanged but it must be written only when the 8 bits of NMU[0-7] are set to level 0.

The man of the art will understand that other kind of memory structures can be used with the invention. In addition, the definition of the "memory block" in the invention correspond to the size used for the erasing of data and that, depending of the memory structure, it could be the same as a memory page. In addition, the size of the memory will influence the size of the fields used for the address or the number in the erasing queue.

Now, it is explained in relation with FIGS. 5 to 8 how the invention works. On FIG. 5, it is represented an example of memory implementing the invention. The FIG. 6 represents an index of the memory of FIG. 5 used as circular buffer. As it can be seen, the index may comprise a lower number of blocks than the LNVM in such a way that several index can be managed on a same memory. The index is stored inside the RAM or inside the SNVM. If the RAM is used for storing the index, it should be stored before switching off the power or it should be reconstructed at each power on using the metadata of the LNVM. Such a reconstruction is not necessary if the index is stored in the SNVM.

The address @ corresponds to the physical address in the memory also indicated in the index as Phy@. The virtual address Virt@ corresponds to the address inside the index. In the index, the binary information Erased corresponds to the reverse of the bit Used in the memory, and the binary information TBE corresponds to the bit NMU.

In the index of FIG. 6, we show a reserve of 4 erased pages that the invention will try to maintain in a time independent of the writing operation. It is also indicated that the index already points on blocks to be erased that will be the next page to erase when the microprocessor has time to do it. So when a write operation is required, the index will take the first erased block to write the data, which is Virt@ 06. After the writing of the data this address is no more available as an erased address, as it can be seen on FIG. 7.

The processor performs the erasing operation only to maintain a predetermined number of erased page in such a way that a reserve of blocks always exists. Each time the number of erased blocks is below the predetermined number and each time the memory is not used, the microprocessor launches an erasing operation.

With a smart card compliant with ISO7816 or ISO14443, the reception of a command has a time duration that can be of the same time of a block erasing. During the reception of a command only the RAM is used for buffering the command. So each time the microprocessor detects the reception of a command on its interface I1 or I2, he can use the reception time as an idle time for erasing a block to be erased. In addition, after the sending of an answer, the microprocessor can try to launch an erasing before the reception of a next command but in that case there is a risk of tearing with a power cut off during the erasing. If the erasing is not performed completely, the bits of the LNVM and the index still indicate that the block is to be erased. So the erasing can be made again at the next command reception. Of course if a smart card is plug into a card reader without command reception, the microprocessor can try to erase as many blocks than needed.

On FIG. 7, the index indicates that only 3 blocks are erased while the predetermined number is 4. When the microprocessor µP detects an appropriate time for erasing a block, the next block to be erased is selected then erased. Preferentially, the oldest block to be erased is chosen by using the EQ Nb which indicates the position inside the erasing queue. As it can be seen on FIG. 7, the block with virtual address Virt@ 0A is the next block. After the erasing of this block, the index is updated as indicated on FIG. 8.

The man of the art will understand that the example was done on a reduced size of index and limited number of pre-erased page for explanation purpose. In the practice, the indicated number can be strongly increased.

The invention claimed is:

1. A method for managing a non-volatile memory erasable by block comprising:
managing an index of the memory blocks wherein the index indicates, in a first field, for each block whether the block is erased and, in a second field, whether the block is no more used and therefore a candidate to be erased, by a memory manager performing a block erasure when the memory is not in use and a block is to be erased and when the number of erased blocks is lower than a predetermined number.

2. The method of claim 1, wherein the block erasing is made on the oldest available block that is not erased.

3. The method of claim 1, wherein the index management is made on a number of blocks lower than the total number of blocks of the memory.

4. The method of claim 1, wherein the memory is inside an electronic device receiving commands according ISO7816 or ISO14443, and wherein the block erasing is made during an idle time of said commands.

5. The method of claim 1 wherein the second field of the index indicating that a block is no more used corresponds to a metadata field for the block indicating that the block is no more used.

6. The method of claim 5 wherein the metadata field for the block indicating that the block is no more used is a word having at least one bit corresponding to each page of a block wherein the at least one bit corresponding to each page is set to binary 0 when the page is no more used whereby if all pages of a block are no more used, the word having at least one bit corresponding to each page of a block has the value zero.

7. The method of claim 1 further comprising:
storing in a metadata field for each block no more used a position for the block in an erasing queue and in the index of the memory blocks; and
when performing block erasure, erasing a block by selecting a block to be erased based on the indicated positions in the erasing queue.

8. The method of claim 1 comprising:
storing a to-be-erased field and a no-more-used field in a metadata area of each block;
storing the index of the memory blocks in a dynamic memory; and
in the event of power off, storing the index in non-volatile memory.

9. The method of claim 1 comprising:
storing a to-be-erased field and a no-more-used field in a metadata area of each block;
storing the index of the memory blocks in a dynamic memory; and
in the event of power on, reconstructing the index from the metadata area of each block.

10. An electronic device comprising at least one electrically erasable non-volatile memory which is erasable by blocks and a memory controller wherein the memory controller comprises an index of the memory storing, in a first field, for each block an indication of whether the block is erased and, in a second field, whether the block is no more used and therefore a candidate to be erased, wherein the memory controller performs a block erasure when the memory is not in use and a block is to be erased and when the index indicates that the number of erased blocks is lower than a predetermined number.

11. The electronic device of claim 10 wherein the second field of the index indicating that a block is no more used corresponds to a metadata field for the block indicating that the block is no more used.

12. The electronic device of claim 11 wherein the metadata field for the block indicating that the block is no more used is a word having at least one bit corresponding to each page of a block wherein the at least one bit corresponding to each page is set to binary 0 when the page is no more used whereby if all pages of a block are no more used, the word having at least one bit corresponding to each page of a block has the value zero.

13. The electronic device of claim 10 further comprising:
an erase-queue-position metadata field stored in each block no more used and in the index of the memory blocks, the erase-queue-position indicating a position for the block in an erasing queue; and
when performing block erasure, erasing a block by selecting a block to be erased based on the indicated positions in the erasing queue.

14. The electronic device of claim 10 comprising:
a to-be-erased field and a no-more-used field in a metadata area of each block;
wherein the index of the memory blocks is stored in a dynamic memory; and
the memory controller is configured to, in the event of power off, storing the index in non-volatile memory.

15. The electronic device of claim 10 comprising:
a to-be-erased field and a no-more-used field in a metadata area of each block;
wherein the index of the memory blocks is stored in a dynamic memory; and
the memory controller is configured to, in the event of power on, reconstructing the index from the metadata area of each block.

* * * * *